(12) United States Patent
Park

(10) Patent No.: US 9,711,749 B2
(45) Date of Patent: Jul. 18, 2017

(54) ORGANIC LIGHT EMITTING DISPLAY APPARATUS AND METHOD FOR MANUFACTURING THE SAME

(71) Applicant: LG DISPLAY CO., LTD., Seoul (KR)

(72) Inventor: Eunjung Park, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 48 days.

(21) Appl. No.: 14/812,780

(22) Filed: Jul. 29, 2015

(65) Prior Publication Data
US 2016/0155978 A1 Jun. 2, 2016

(30) Foreign Application Priority Data
Dec. 2, 2014 (KR) .................. 10-2014-0170330

(51) Int. Cl.
*H01L 51/50* (2006.01)
*H01L 51/56* (2006.01)
*H01L 51/00* (2006.01)
*H01L 27/32* (2006.01)

(52) U.S. Cl.
CPC ...... *H01L 51/5088* (2013.01); *H01L 27/3246* (2013.01); *H01L 51/0026* (2013.01); *H01L 51/5012* (2013.01); *H01L 51/5056* (2013.01); *H01L 51/5072* (2013.01); *H01L 51/56* (2013.01); *H01L 2251/558* (2013.01)

(58) Field of Classification Search
CPC ............ H01L 51/0545; H01L 51/0036; H01L 51/0541; H01L 51/5012
See application file for complete search history.

(56) References Cited

U.S. PATENT DOCUMENTS

| 7,199,516 | B2 * | 4/2007 | Seo ..................... H01L 27/3246 313/504 |
| 9,093,648 | B2 * | 7/2015 | Uchida ............... H01L 27/3246 |
| 9,257,664 | B2 * | 2/2016 | Ito ....................... H01L 51/5088 |

* cited by examiner

*Primary Examiner* — Quoc Hoang
(74) *Attorney, Agent, or Firm* — Birch, Stewart, Kolasch & Birch, LLP

(57) ABSTRACT

An organic light emitting display (OLED) device, and a method for manufacturing the OLED device are discussed. The OLED device according to one embodiment includes a substrate; an anode formed on the substrate; a bank formed on the substrate to partially overlap the anode; an organic light emitting element including a portion of a common layer on the anode and another portion of the common layer on the bank, the portion of the common layer on the bank being thinner than the another portion of the common layer on the anode; and a cathode fanned above the portion of the common layer on the anode and the another portion of the common layer on the bank.

14 Claims, 6 Drawing Sheets

ORGANIC LIGHT EMITTING DISPLAY APPARATUS AND METHOD FOR MANUFACTURING THE SAME

CROSS-REFERENCE TO RELATED APPLICATIONS

This application claims the priority of Korean Patent Application No. 10-2014-0170330 filed on Dec. 2, 2014, in the Korean Intellectual Property Office, the entire contents of which are incorporated herein by reference.

BACKGROUND

Field of the Invention

The present invention relates to an organic light emitting display (OLED) device having improved durability, and a method for manufacturing the same.

Description of the Related Art

An OLED device is a self-light emitting display device that does not need a separate light source such as a backlight for a liquid crystal display (LCD). Thus, the OLED device can be lightweight and thin. Further, the OLED device has efficient power consumption because it is driven with a low voltage. Also, the OLED device has excellent color expression ability, a high response speed, a wide viewing angle, and a high contrast ratio (CR).

The OLED device includes a plurality of organic light emitting elements that respectively function as sub-pixels of the OLED device. The sub-pixels include a red sub-pixel that emits a red light, a green sub-pixel that emits a green light, and a blue sub-pixel that emits a blue light.

Each of the sub-pixels of the OLED device includes an anode, a common layer, an organic light emission layer, and a cathode. Anodes are separated from the respective sub-pixels, but a common layer is formed on the entire surface of a substrate so as to cover the anodes of the respective sub-pixels. An organic light emitting element emits light using holes supplied from the anode and electrons supplied from the cathode. Holes supplied to a specific sub-pixel can leak into another adjacent sub-pixel through the common layer. For example, holes supplied to a sub-pixel that emits a blue light may not move to an organic light emission layer of the sub-pixel that emits a blue light but, may leak into a sub-pixel that emits a red light or a sub-pixel that emits a green light through the common layer. Such a leakage current causes other nearby sub-pixels to emit light and change color characteristics of the OLED device.

In other words, the OLED device according to related art can have a leakage current that flows between nearby sub-pixels due to a common layer with a large thickness that is on a bank for separating the sub-pixels. As a result of the leakage current flowing between the nearby sub-pixels, the OLED device according to related art can have a light leakage problem.

SUMMARY

Accordingly, an object of the present invention is to provide an OLED device capable of decreasing a leakage current through a common layer which would ultimately minimize light emission from adjacent sub-pixels when light is emitted at a low gray level, and a method for manufacturing the same.

Another object of the present invention is to provide an organic light emitting element, in which a thickness of a common layer on a bank is smaller than a thickness of the common layer on an anode. Thus, a dopant material can be easily doped in the common layer. As a result, injection characteristics of holes and electrons as well as lifetime and efficiency of an organic light emitting element can be improved.

The objects of the present invention are not limited to the aforementioned objects, and other objects, which are not mentioned above, will be apparent to a person having ordinary skill in the art from the following description. Details of other exemplary embodiments will be included in the detailed description of the invention and the accompanying drawings.

The embodiments of the present invention can suppress a current leaking through a common layer and minimize light emission from adjacent sub-pixels when light is emitted at a low gray level due to the leakage current. Thus a change in color characteristics of an OLED device can be minimized. The embodiments of the present invention can also dope a common layer with more dopant materials and improve injection characteristics of holes and electrons of an organic light emitting element. The embodiments of the present invention also improve a lifetime and an efficiency of the organic light emitting element. The effects of the present invention are not limited to the aforementioned effects, and other various effects are included in the present specification.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE INVENTION

Figure 1:
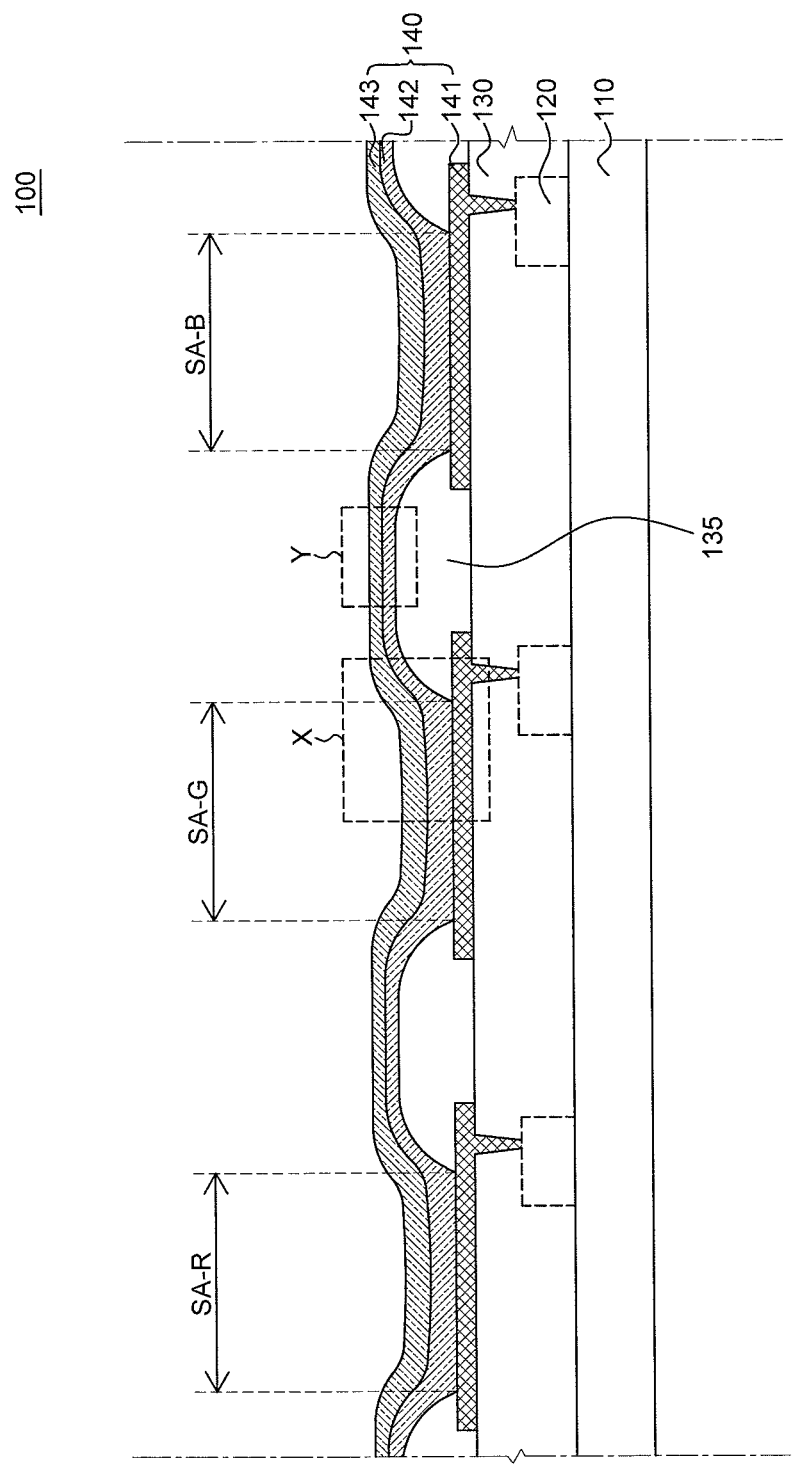
FIG. 1 is a schematic cross-sectional view of an OLED device according to an embodiment of the present invention.

Advantages and features of the present invention, and methods for accomplishing the same will be more clearly understood from embodiments described below with reference to the accompanying drawings. However, the present invention is not limited to the following embodiments but can be implemented in various different forms. The embodiments are provided only to provide a complete description of the present invention and fully convey a spirit of the invention to a person having ordinary skill in the art to which the present invention pertains. The present invention will be defined by the appended claims. However, the present invention is not limited thereto.

The shapes, sizes, ratios, angles, numbers, and the like illustrated in the accompanying drawings for describing the embodiments of the present invention are merely examples, and the present invention is not limited thereto. Like reference numerals generally denote like elements throughout the present specification wherever possible. Further, in the following description, a detailed explanation of known related technologies may be omitted to avoid unnecessarily obscuring the subject matter of the present invention. The terms such as "including," "having," and "consist of" used herein are generally intended to allow other components to be added unless the terms are used with the term "only." Any references to singular may include plural unless expressly stated otherwise.

Components are interpreted to include a range of ordinary error even if not expressly stated. When the position relation between two parts is described using the terms such as "on," "above," "below," and "next," one or more parts can be positioned between the two parts unless the terms are used with the term "immediately," or "directly" is not used. When an element or layer is referred to as being "on" another element or layer, it can be directly on the other element or layer, or intervening elements or layers can be present. Although terms, for example, "first" and "second" are used for describing various components, these components are not confined by these terms. These terms are merely used for distinguishing one component from the other components. Therefore, a first component to be mentioned below can be a second component in a technical concept of the present invention.

Throughout the whole specification, the same reference numerals denote the same elements wherever possible. Because, size and thickness of each component illustrated in the drawings are represented for convenience in explanation, the present invention is not necessarily limited to the illustrated size and thickness of each component. The features of various embodiments of the present invention can be partially or entirely bonded to or combined with each other and can be interlocked and operated in technically various ways as can be fully understood by a person having ordinary skill in the art, and the embodiments can be carried out independently of or in association with each other. Various embodiments of the present invention will be described in detail with reference to the accompanying drawings.

Figure 2:
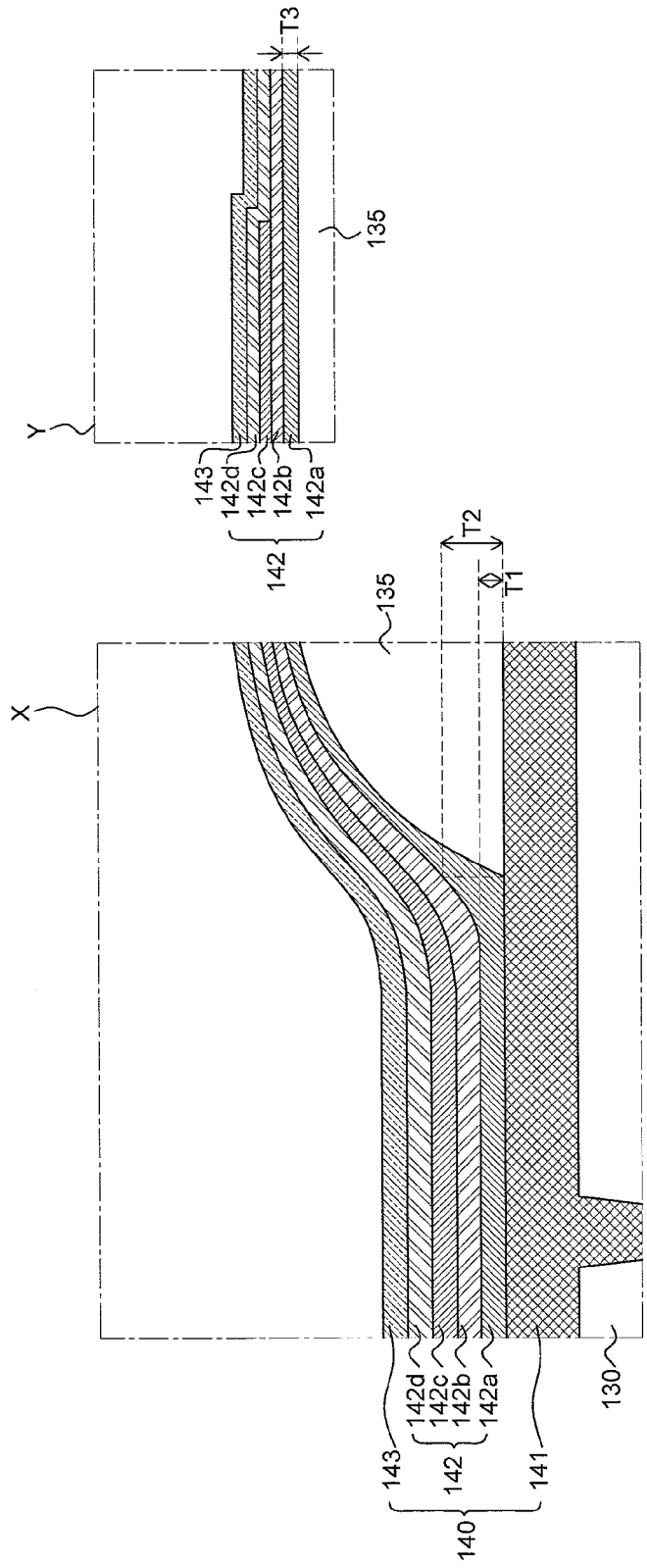
FIG. 2 provides schematic enlarged cross-sectional views of areas X and Y of FIG. 1 in the OLED device according to the embodiment of the present invention.

FIGS. 1 and 2 are views of an OLED device according to an embodiment of the present invention. In particular, FIG. 1 is a schematic cross-sectional view of the OLED device according to the embodiment of the present invention. FIG. 2 provides schematic enlarged cross-sectional views of areas X and Y of FIG. 1 in the OLED device according to the embodiment of the present invention.

Referring to FIG. 1, an OLED device 100 includes a substrate 110, a thin film transistor 120, a planarization layer 130, a bank 135, and an organic light emitting element 140 including an anode 141, an organic layer structure 142, and a cathode 143. The OLED device 100 is a top-emission OLED device in which light emitted from the organic layer structure 142 is released through the cathode 143 in a direction toward a top surface of the substrate on which the thin film transistor 120 is formed, i.e., in a direction toward the cathode 143. In the OLED device 100, the anode 141 may further include a separate reflective layer such that light emitted from the organic layer structure 142 is released through the cathode 143. However, the present invention is not limited thereto. The OLED device 100 may be a bottom-emission OLED device in which light emitted from the organic layer structure 142 is released in a direction toward the anode 141. In this case, a position of the thin film transistor 120 may be moved below the bank 135.

The substrate 110 according to the embodiment includes a red sub-pixel area SA-R, a green sub-pixel area SA-G, and a blue sub-pixel area SA-B. Each of the sub-pixel areas SA-R, SA-G, SA-B, and SA-W is defined by the anode 141 exposed by the bank 135. An array of sub-pixels SA-R, SA-G, SA-B, and SA-W include the anode 141 for each sub-pixel and the bank 135 on the anode 141 to separate adjacent the sub-pixels SA-R, SA-G, SA-B, and SA-W. The organic light emitting element 140 and the thin transistor 120 used for driving the organic light emitting element 140 are disposed on the sub-pixel areas SA-R, SA-G, and SA-B. A coplanar thin film transistor 120 including an active layer, a gate electrode, a source electrode, and a drain electrode can be formed on the substrate 110. The active layer is insulated from the gate electrode by a gate insulating layer. The gate electrode is insulated from the source electrode and the drain electrode by an inter-layer dielectric layer. However, the thin film transistor 120 is not limited thereto, and can be a thin film transistor of various structures.

The planarization layer 130 is formed on the thin film transistor 120. The planarization layer 130 is a layer configured to planarize an upper part of the thin film transistor 120. The planarization layer 130 includes a contact hole configured to expose at least a part of the drain electrode or the source electrode of the thin film transistor 120.

The organic light emitting element 140 including the anode 141, the organic light emission layer, and the cathode 143 is formed on the planarization layer 130. The anode 141 is connected with the source electrode or the drain electrode of the thin film transistor 120 through the contact hole of the planarization layer 130. The anode 141 is configured to supply holes to the organic light emission layer and may be formed of a material including, for example, a transparent conductive oxide with a high work function value. On a side surface of the anode 141, the bank 135 configured to cover an end portion of the anode 141 is disposed. At least a part of the anode 141 is exposed by the bank 135.

A plurality of banks 135 are disposed among the red sub-pixel SA-R, the green sub-pixel SA-G, and the blue sub-pixel SA-B. For example, the banks can be disposed between the red sub-pixel SA-R and the green sub-pixel SA-G, between the green sub-pixel SA-G and the blue sub-pixel SA-B, and between the blue sub-pixel SA-B and the red sub-pixel SA-R.

The organic layer structure 142 is formed of a plurality of layers to emit light. The organic layer structure 142 includes an organic light emission layer formed of an organic light emitting material used for emitting light with a specific wavelength and a common layer for supplying holes and electrons to the organic light emission layer. In FIG. 1, the organic layer structure 142 is formed into a single light emission unit including an organic light emission layer in each of the red sub-pixel SA-R, the green sub-pixel SA-G, and the blue sub-pixel SA-B. The common layer is disposed on the entire surface of the substrate 110 and along a top surface of the bank 135. Specifically, the common layer is formed into a single layer covering all of the bank 135 and the anode 141.

The cathode 143 is formed on the organic layer structure 142. The cathode 143 is configured to supply electrons to the organic light emission layer and is formed of a material having a high electrical conductivity and a low work function value. If the OLED device 100 is a top-emission OLED device, the cathode 143 is formed of a very thin metallic material or transparent conductive oxide. For example, the cathode 143 can be formed of a metallic material having a thickness of several hundred Å or less. In this case, the cathode 143 becomes substantially a semi-transmission layer or transparent layer, and light from the organic light emission layer can be released through the cathode 143. An encapsulation layer used for protecting the organic light emitting element 140 against moisture, air, or a physical shock from the outside can be further formed on the cathode 143. In the OLED device 100 according to the embodiment of the present invention, a thickness of one of the plurality of layers including the organic layer structure 142 is smaller on the bank 135 than that on the anode 141.

Referring to FIG. 2, the organic layer structure 142 formed into a single light emission unit on the anode 141 can have a structure in which a hole injection layer (HIL) 142a, a hole transporting layer (HTL) 142b, an organic light emission layer 142c, and an electron transporting layer (ETL) 142d are laminated. The organic light emission layer 142c can be patterned and disposed in between the bank 135 and partially on the bank 135. The organic light emission layer 142c can be a green organic light emission layer. Since the hole injection layer 142a, the hole transporting layer 142b and the electron transporting layer 142d cover the anode 141 and the bank 135 of each sub-pixel SA-R, SA-G, SA-B and SA-W in common, the hole injection layer 142a, the hole transporting layer 142b and the electron transporting layer 142d are defined as a common layer. Otherwise, the organic layer structure 142 formed into a single light emission unit may further include an electron injection layer (EIL) on the electron transporting layer 142d.

The hole injection layer 142a has a thickness T1 on the anode 141. The hole injection layer 142a is extended from the anode 141 while ascending to the bank 135, and has a thickness T2 on a starting point of the bank 135. The hole injection layer 142a extends to, and ascends, the bank 135 and has a thickness T3 on the bank 135. That is, the hole injection layer 142a is formed to have the greatest thickness on the starting point of the bank 135, the second greatest thickness on the anode 141, and the smallest thickness on the bank 135.

In related art, if a current flows into the organic layer structure 142 through the anode 141 and the cathode 143 of the OLED device 100, an electric field is generated in a vertical direction, connecting the anode 141 and the cathode 143, and the organic light emitting element 140 emits light. A current can leak in a horizontal direction through the conductive hole injection layer 142a. Because the hole injection layer 142a is formed on the entire surface of the substrate 110, a current crosses over the bank 135 on the anode 141 and then to the adjacent anode 141.

However, in the OLED device 100 according to the embodiment of the present invention, a thickness of one layer of the organic layer structure 142 is smaller on the bank 135 than that on the anode 141. For example, the common layer of the organic layer structure 142 has the first thickness on the bank 135 and the second thickness on the anode 141. The first thickness of the common layer is smaller than the second thickness of the common layer. The first thickness of the common layer is sufficiently thin enough to suppress current from leaking laterally into adjacent sub-pixels in order to minimize undesired light emissions therefrom. Thus, a size of the path of a leakage current from a sub-pixel to another sub-pixel is substantially reduced. Therefore, an amount of current leaking from a sub-pixel to another sub-pixel is remarkably decreased, and, thus, an undesired light emission from an adjacent sub-pixel is reduced.

Figure 3:
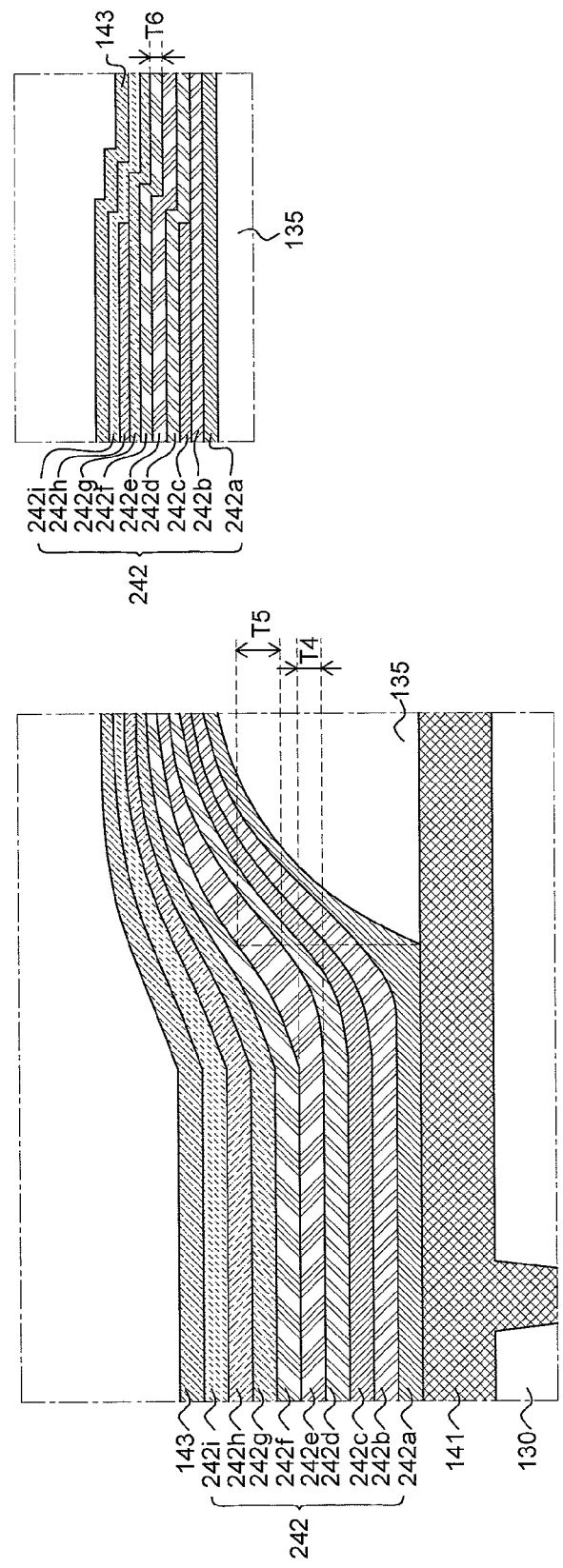
FIG. 3 is a schematic cross-sectional view of an OLED device according to another embodiment of the present invention.

Next, FIG. 3 is a schematic cross-sectional view of an OLED device according to another embodiment of the present invention. The planarization layer 130, the anode 141, the bank 135, and the cathode 143 of an OLED device 200 illustrated in FIG. 3 are substantially the same as the planarization layer 130, the anode 141, the bank 135, and the cathode 143 illustrated in FIG. 2. Thus, redundant explanation thereof will be omitted.

In the OLED device 200 according to the another embodiment of the present invention, an organic layer structure 242 has a structure including two light emission units. The organic layer structure 242 includes a first light emission unit, a charge generation layer, and a second light emission unit. The first light emission unit has a first set of layers including a hole injection layer 242a, a hole transporting layer 242b, an organic light emission layer 242c, and an electron transporting layer 242d. The charge generation layer on the first light emission unit has a second set of layers in which an n-type charge generation layer 242e and a p-type charge generation layer 242f are laminated. The second light emission unit has a third set of layers including a hole transporting layer 242g, an organic light emitting layer 242h, and an electron transporting layer 242i. For example, the first and second light emission units can be configured to emit blue light.

The charge generation layer can generate a charge or divide the charge into a hole and an electron. It can inject the charge into the first and second light emission units. The n-type charge generation layer 242e supplies electrons to the organic light emission layer 242c of the first light emission unit adjacent to the anode 141, and the p-type charge generation layer 242f supplies holes to the organic light emission layer 242h of the second light emission unit adjacent to the cathode 143. Thus, luminance efficiency of an organic light emitting element 240 including a plurality of light emission units can be maintained high, and a driving voltage can be reduced.

In the OLED device 200 according to the another embodiment of the present invention, a thickness of the n-type charge generation layer 242e as one of the second set of layers is smaller on the bank 135 than that on the anode 141. Further, a thickness of the p-type charge generation layer 242f as one of the second set of layers is very small on the bank 135. A thickness T6 of the n-type charge generation layer 242e on the bank 135 is smaller than a thickness T4 on the anode 141. A thickness T5 on a starting point of the bank 135 is greater than the thickness T4 on the anode 141.

In order for the n-type charge generation layer 242e to easily supply electrons, the n-type charge generation layer 242e can be doped with a conductive material, for example, an alkali metal such as lithium (Li). Further, in order for the p-type charge generation layer 242f to easily supply holes, the p-type charge generation layer 242f can be doped with various dopants. Thus, the above-described leakage of current in a horizontal direction can occur through the n-type charge generation layer 242e or the p-type charge generation layer 242f. However, in the OLED device 200 according to the another embodiment of the present invention, a thickness of the n-type charge generation layer 242e or a thickness of the p-type charge generation layer 242f or a total thickness of the hole injection layer 242a, the n-type charge generation layer 242e and the p-type charge generation layer 242f is very small on the bank 135. Thus, an amount of current leaking to an adjacent sub-pixel is remarkably decreased.

Since the amount of current leaking to the adjacent sub-pixel is decreased, at least one conductive layer (i.e., n-type charge generation layer 242e or the p-type charge generation layer 242f) in the common layer has a higher doping concentration compare to a conductive layer in a conventional common layer. The conventional common layer has a substantially uniform thickness on the bank 135 and the anode 141. If a doping concentration of the conductive layer in the conventional common layer becomes higher, an amount of current leaking to an adjacent sub-pixel is also increased. Thus, a doping concentration of the conductive layer in the conventional common layer is limited to reduce an amount of current leaking to an adjacent sub-pixel. On the other hand, the common layer according to the embodiment has a first thickness on the bank 135 and a second thickness on the anode 141, and the first thickness is smaller than the second thickness. Since the first thickness of the common layer is sufficiently thin enough to suppress current from leaking laterally into an adjacent sub-pixels, the conductive layer in the common layer can be doped with a high doping concentration without concern for leaking current. Therefore, at least one conductive layer in the common layer has a higher doping concentration compare to the conductive layer in the conventional common layer.

If an amount of current leaking from a sub-pixel to another sub-pixel is decreased, light emission from an adjacent sub-pixel is reduced. For example, when a blue sub-pixel emits light, light emission from a part of an adjacent green sub-pixel is reduced. Such a phenomenon is most prominent in a case of low gray level emission where only one sub-pixel emits light. However, in the OLED device 200 according to the another embodiment of the present invention, an adjacent sub-pixel does not emit light even in the case of low gray level emission.

Figure 4:
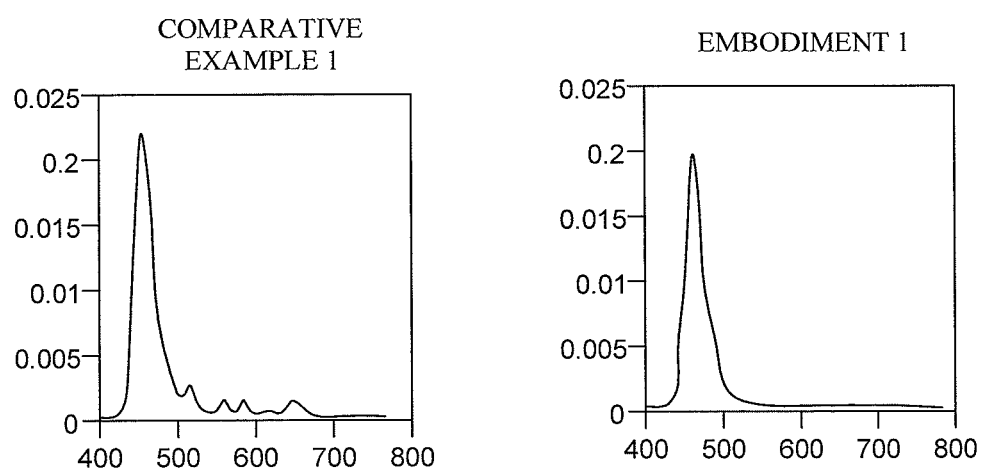
FIG. 4 provides graphs for evaluating parasitic light emission from the OLED device according to another embodiment of the present invention.

Next, FIG. 4 provides graphs for evaluating parasitic light emission of the OLED device according to another embodiment of the present invention. In Comparative Example 1, Indium Tin Oxide (ITO) was deposited on a substrate. HAT-CN was deposited as a hole injection layer, and NPD (N,N-dinaphthyl-N,N'-diphenyl benzidine) was deposited as a hole transporting layer on the hole injection layer. Then, red, green, and blue organic light emission layers were formed on the hole injection layer respectively and an electron transporting layer was deposited. An n-type charge generation layer doped with Li as a dopant was deposited. Then, a p-type charge generation layer and a hole transporting layer were deposited in sequence and then, red, green, and blue organic light emission layers were formed again.

The electron transporting layer on the second organic light emission layer was formed using Alq3(tris(8-hydroxyquinolino)aluminum), and a cathode was deposited thereon. An organic light emitting element was manufactured in Embodiment 1 under the same condition as Comparative Example 1, and then the organic light emitting element was heated at 95° C. for 24 hours, thereby manufacturing an OLED device according to the another embodiment of the present invention. Only a blue sub-pixel is allowed to emit light, and then an emission spectrum was measured. An x-axis represents a wavelength band of an emitted light and a y-axis represents intensity (a.u.) of an emitted light.

In Comparative Example 1, a peak with the greatest intensity was illustrated at 440 nm and tiny peaks were illustrated to be 500 nm to 650 nm in a wavelength band. However, in Embodiment 1, a peak was present only at 440 nm but no peak was observed in the other wavelength bands. Therefore, because a leakage current is rarely present in the OLED device according to the another embodiment of the present invention, no adjacent sub-pixels other than a blue sub-pixel emit light. As a result, the OLED device has improved display quality and reliability at a low gray level, and an amount of current leaking in the n-type charge generation layer is decreased.

In the OLED device according to the another embodiment of the present invention, the n-type charge generation layer is doped with an alkali metal such as Li, and if a doping amount is increased, the number of electrons to be supplied is increased. If the number of electrons supplied to the organic light emission layer is increased, a lower current is consumed as compared with a case where light is emitted at the same luminance. If the organic light emitting element is driven at a low current, the lifetime of the organic light emission layer is increased. Thus, the overall lifetime of the OLED device is also increased.

Figure 5:
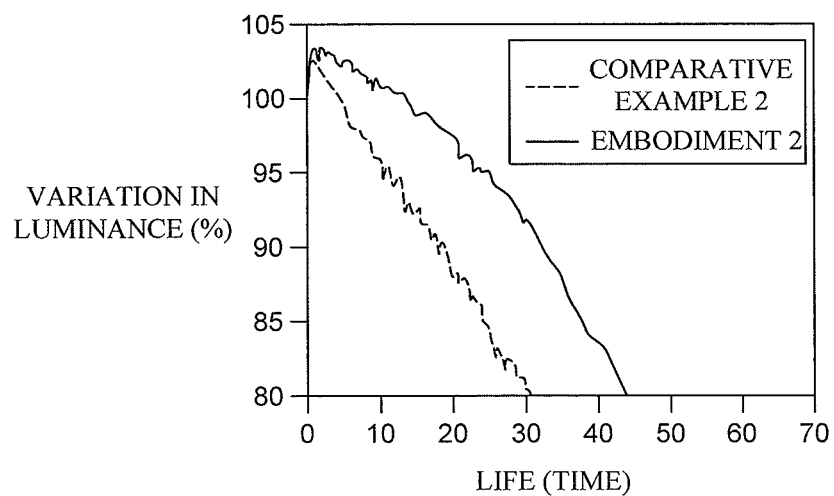
FIG. 5 is a graph provided to describe the lifetime of the OLED device according to another embodiment of the present invention.

Next, FIG. 5 is a graph provided to describe the lifetime of the OLED device according to another embodiment of the present invention. In Comparative Example 2, an organic light emitting element was manufactured in the same manner as Embodiment 1 illustrated in FIG. 4 except that an n-type charge generation layer was doped with Li in an amount of 0.5% of the weight of the n-type charge generation layer, i.e., a host. Further, in Embodiment 2, an organic light emitting element was manufactured in the same manner as Embodiment 1 illustrated in FIG. 4 except that an n-type charge generation layer was doped with Li in an amount of 2.0% of the weight of the n-type charge generation layer.

In Comparative Example 2, luminance of 3200 nit was achieved using a current of 7.076 mA, and in Embodiment 2, the same luminance as Comparative Example 2 was achieved using a current of 6.816 mA. An x-axis represents the lifetime of an organic light emitting element in a time unit and a y-axis represents a variation in luminance. If the same luminance was achieved, an OLED device, in which a Li doping amount for an n-type charge generation layer is increased, uses a lower current at the same luminance. Thus, the lifetime of an organic light emitting element can be improved.

In the OLED device according to the another embodiment of the present invention, a thickness of the n-type charge generation layer, which can be a path for a leakage current between sub-pixels, is remarkably reduced on the bank. Therefore, even if a doping amount of alkali metal is increased, a leakage current flowing into an adjacent sub-pixel can be maintained sufficiently low. Further, since the doping amount of alkali metal is increased, the number of electrons supplied to the organic light emission layer is also increased. Thus, efficiency of the organic light emission layer is increased and durability of the OLED device is improved overall.

Figure 6:
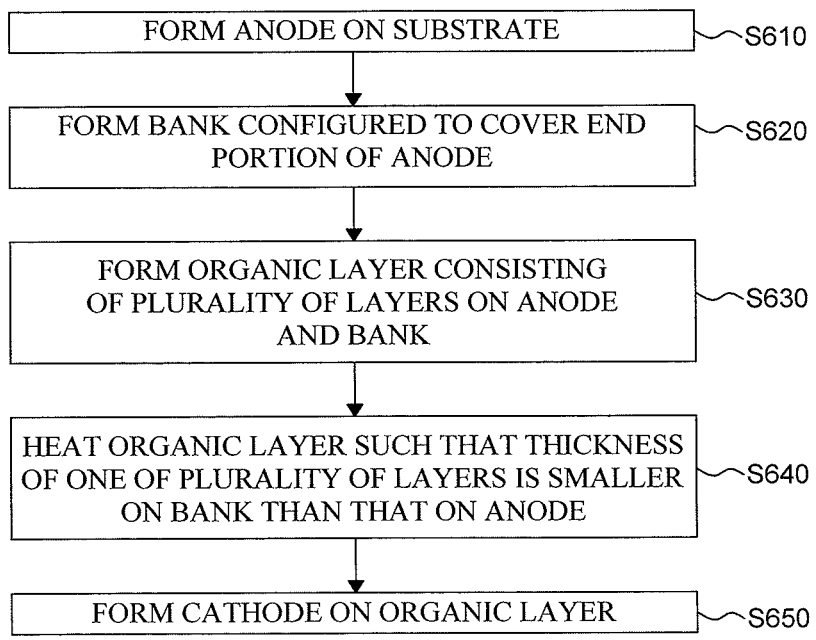
FIG. 6 is a schematic flow chart provided to describe a method for manufacturing a liquid crystal display device according to another embodiment of the present invention.

Next, FIG. 6 is a schematic flow chart provided to describe a method for manufacturing a liquid crystal display device according to another embodiment of the present invention. Firstly, an anode is formed on a substrate (S610). The anode may include a transparent conductive layer having a high work function value. The transparent conductive layer may be formed of transparent conductive oxide and may be formed of, for example, indium tin oxide (ITO), indium zinc oxide (IZO), indium tin zinc oxide (ITZO), and zinc oxide (ZnO).

Then, a bank configured to cover an end portion of the anode is formed (S620). The bank may be formed of a photoresist. An organic layer structure including plurality of layers is formed on the anode and the bank (S630). The plurality of layers includes a first light emission unit, a charge generation layer, and a second light emission unit. The first light emission unit includes a hole injection layer, a hole transporting layer, an organic light emission layer, and an electron transporting layer. The charge generation layer includes an n-type charge generation layer and a p-type charge generation layer. The second light emission unit includes a hole transporting layer, an organic light emitting layer, and an electron transporting layer.

The hole injection layer facilitates an injection of holes from the anode into the organic light emission layer, and can be formed of a material selected from, for example, PANI (polyaniline), NPD(N,N-dinaphthyl-N,N'-diphenyl benzidine), CuPc(cupper phthalocyanine), and PEDOT(poly(3, 4)-ethylenedioxythiophene), but is not limited thereto. The hole transporting layer facilitates a transport of holes, and may be formed of a material selected from, for example, NPD(N,N-dinaphthyl-N,N'-diphenyl benzidine), and TPD (N,N'-bis-(3-methylphenyl)-N,N-bis-(phenyl)-benzidine), but is not limited thereto.

The organic light emission layer emits light of a specific wavelength. The organic light emission layer is formed of a host and various dopants included in the host. In order to emit light of a blue wavelength, an anthracene-based host and a pyrene-based dopant may be used. The organic light emission layer may be formed of a material selected from, for example, ADN(9,10-di(2-naphthyl)anthracene), CBP(4, 4'-N,N'-dicarbazolbiphenyl), and DPVBi(4,4'-bis(2,2-diphenylethen-1-yl)-diphenyl), but is not limited thereto. As a dopant, there may be used various materials that enable an emitted light to have a desired wavelength. For example, a dopant material may be selected from 1,6-Bis(diphenylamine)pyrene, or TBPe(tetrakis(t-butyl)perylene), to emit light of a blue wavelength, Ir(piq)2acac(Bis(1-phenylisoquinoline)(acetylacetonate)iridium (III)) to emit light of a red wavelength, or Irppy3(fac-tris(2-pheny-lpyridine)iridium) to emit light of a green wavelength.

The electron transporting layer is formed on the organic light emission layer and facilitates transport of electrons, and may be formed of a material selected from, for example, Alq3(tris(8-hydroxyquinolino)aluminum), TAZ(3-phenyl-4-(1-naphthyl)-5-phenyl-1,2,4-triazole), or Balq(bis(2-methyl-8-quinolinate), but is not limited thereto. In some embodiments, an electron injection layer formed of a metal halide compound such as MgF2, LiF, NaF, KF, RbF, CsF, FrF, and CaF2 may be further formed.

Then, the organic layer structure is heated such that a thickness of one of the plurality of layers is smaller on the bank than that on the anode (S640). The heat treatment of the organic layer structure can be performed under specific condition. For example, the heat treatment of the organic layer structure can be performed at 80 to 100° C. or less for 12 to 48 hours, for example, at 95° C. for 24 hours. Because the organic layer structure is heated, at least one layer, particularly conductive layers, of the organic layer structure formed on the bank can flow on the bank in a direction toward the anode. For example, some materials in the common layer of the organic layer structure can flow down and gather at a base of the bank during the heat treatment. Because at least one layer of the organic layer structure formed on the bank flows in the direction toward the anode, a thickness of one layer, for example, the hole injection layer, of the plurality of layers of the organic layer structure can be greater on a starting point of the bank than that on the anode (refer to FIG. 2). Thus, a thickness of the hole injection layer on the bank becomes smaller than a thickness of the hole injection layer on the anode.

The heat treatment of the organic layer structure can be performed while the organic layer structure is formed. If the heat treatment is performed while the organic layer structure is formed, the organic layer structure can flow from the bank to the anode from the time when each layer is formed. Therefore, a thickness of the organic layer structure formed on the bank can be further decreased.

Otherwise, the organic layer structure can be heated by irradiating a laser beam to the bank on which the organic layer structure is disposed. For example, a laser beam of intensity that does not cause damage to the organic light emission layer is irradiated on the bank in order for the organic layer structure on the bank to flow down and gather at a base of the bank.

The cathode is formed on the organic layer structure. The cathode needs to supply electrons. Thus, the cathode is formed of a material with a high electrical conductivity and a low work function value. For example, the cathode may be formed of a metallic material such as silver (Ag), titanium (Ti), aluminum (Al), gold (Au), molybdenum (Mo), or an alloy of silver (Ag) and magnesium (Mg). In some embodiments, the cathode may be formed of, for example, ITO or IZO, but is not limited thereto. In the method for manufacturing an OLED device according to the another embodiment of the present invention, the layers on the bank which may cause a leakage of current are decreased in thickness, resulting in an improvement in reliability of the OLED device.

Although the embodiments of the present invention have been described in detail with reference to the accompanying drawings, the present invention is not limited thereto and may be embodied in many different forms without departing from the technical concept of the present invention. Therefore, the embodiments of the present invention are provided for illustrative purposes only but not intended to limit the technical concept of the present invention. Therefore, it should be understood that the above-described embodiments are illustrative in all aspects and do not limit the present invention. The protective scope of the present invention should be construed based on the following claims, and all the technical concepts in the equivalent scope thereof should be construed as falling within the scope of the present invention.

What is claimed is:

1. An organic light emitting display (OLED) device comprising:
   a substrate;
   an anode on the substrate;
   a bank on the substrate to partially overlap the anode;
   an organic light emitting element including a common layer on the anode and the bank, a thickness of the common layer on the bank being smaller than a thickness of the common layer on the anode; and
   a cathode above the common layer on the anode and the bank,
   wherein the common layer included in the organic light emitting element includes a first organic light emission layer, a n-type charge generation layer on the light emission layer, a p-type charge generation layer on the n-type charge generation layer, and a second organic light emission layer on the p-type charge generation layer, and
   wherein a thickness of each of the n-type charge generation layer and the p-type charge generation layer on the bank is smaller, respectively, than a thickness of each of the n-type charge generation layer and the p-type charge generation layer on the anode.

2. The OLED device according to claim 1, wherein the common layer included in the organic light emitting element further includes a hole injection layer.

3. The OLED device according to claim 2, wherein a thickness of the hole injection layer on a starting point of the bank is greater than a thickness of the hole injection layer on a center of the anode, and
wherein a thickness of the hole injection layer on a center of the bank is smaller than the thickness of the hole injection layer on the center of the anode.

4. The OLED device according to claim 1, wherein the common layer on a portion of the bank overlapping the anode includes the first organic light emitting layer and the second organic light emitting layer and
the common layer on a center of the bank does not include the first organic light emitting layer and the second organic light emitting layer.

5. The OLED device according to claim 1, wherein the common layer included in the organic light emitting element further includes a hole injection layer, a hole transporting layer, and an electron transporting layer.

6. The OLED device according to claim 5, wherein a thickness of each of the hole injection layer, the hole transporting layer, the organic light emitting layer, and the electron transporting layer on the bank is smaller, respectively, than a thickness of each of the hole injection layer, the hole transporting layer, and the electron transporting layer on the anode.

7. The OLED device according to claim 5, wherein the hole injection layer extends from the anode and ascends to the bank, and has a smaller thickness on the bank than a thickness on a starting point of the bank.

8. The OLED device according to claim 1, wherein a thickness of each of the n-type charge generation layer and the p-type charge generation layer on a starting point of the bank is greater, respectively, than a thickness of each of the n-type charge generation layer and the p-type charge generation layer on a center of the anode.

9. The OLED device according to claim 1, wherein the n-type charge generation layer is doped with a conductive material in an amount of 2.0% or more of a weight of the n-type charge generation layer.

10. A method for manufacturing an organic light emitting display (OLED) device, the method comprising:
forming an anode on a substrate;
forming a bank on the substrate to partially overlap the anode;
forming an organic light emitting element including a common layer on the anode and the bank, a thickness of the common layer on the bank being smaller than a thickness of the common layer on the anode; and
forming a cathode above the common layer on the anode and the bank,
wherein the common layer included in the organic light emitting element includes a first organic light emission layer, an n-type charge generation layer on the light emission layer, a p-type charge generation layer on the n-type charge generation layer, and a second organic light emission layer on the p-type charge generation layer, and
wherein a thickness of each of the n-type charge generation layer and the p-type charge generation layer on the bank is smaller, respectively, than a thickness of each of the n-type charge generation layer and the p-type charge generation layer on the anode.

11. The method according to claim 10,
wherein at least one of the first organic light emission layer and the second organic light emission layer is formed by a heat treatment including irradiating a laser beam to the bank while forming the organic light emission element.

12. The method according to claim 11,
wherein heat treatment causes some material in the common layer to flow down and gather at a base of the bank.

13. The method according to claim 10, wherein the common layer included in the organic light emitting element further includes a hole injection layer.

14. The method according to claim 13, wherein a thickness of the hole injection layer on a starting point of the bank is greater than a thickness of the hole injection layer on a center of the anode, and
wherein a thickness of the hole injection layer on the center of the bank is smaller than the thickness of the hole injection layer on a center of the anode.

* * * * *